(12) United States Patent
Lee

(10) Patent No.: US 6,222,756 B1
(45) Date of Patent: *Apr. 24, 2001

(54) SINGLE TRANSISTOR CELL, METHOD FOR MANUFACTURING THE SAME, MEMORY CIRCUIT COMPOSED OF SINGLE TRANSISTOR CELLS, AND METHOD FOR DRIVING THE SAME

(75) Inventor: Jong-ho Lee, Gunpo (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/221,974

(22) Filed: Dec. 29, 1998

(30) Foreign Application Priority Data

Dec. 31, 1997 (KR) .................................................. 97-82107

(51) Int. Cl.⁷ ..................................................... G11C 11/22
(52) U.S. Cl. ................................. 365/145; 365/63; 365/65
(58) Field of Search ............................... 365/145, 65, 63; 257/295

(56) References Cited

U.S. PATENT DOCUMENTS

| | | | |
|---|---|---|---|
| 5,070,385 | 12/1991 | Evans, Jr. et al. | ....................... 357/51 |
| 5,494,117 | * 2/1996 | Larson | ................................ 257/295 |
| 5,519,812 | 5/1996 | Ishihara | ................................. 395/24 |
| 5,541,807 | * 7/1996 | Evans, Jr. et al. | ................. 365/321.5 |
| 5,959,879 | * 2/1999 | Koo | ....................................... 365/145 |
| 5,969,380 | * 10/1999 | Seyyedy | ............................... 257/295 |

\* cited by examiner

Primary Examiner—Richard Elms
Assistant Examiner—Tuan T. Nguyen
(74) Attorney, Agent, or Firm—Jones Volentine, L.L.C.

(57) ABSTRACT

A semiconductor memory device, a method for manufacturing the same, a memory circuit including the semiconductor memory device, and a method for driving the same, are provided. In detail, one transistor forms a memory cell, and a single transistor cell capable of arbitrarily accessing the memory cell, a method for manufacturing the same, a memory circuit, and a method for driving the memory circuit, are provided. An island type semiconductor layer as an active region is formed on a ferroelectric layer. A word line crosses the semiconductor layer. A source is formed on the semiconductor layer on one side of the word line, and a drain is formed on the other side. A plate line is formed below the ferroelectric layer to face the word line, and intersects the word line. A drive line is connected to the source, and a bit line is connected to the drain.

14 Claims, 11 Drawing Sheets

(V)

SINGLE TRANSISTOR CELL, METHOD FOR MANUFACTURING THE SAME, MEMORY CIRCUIT COMPOSED OF SINGLE TRANSISTOR CELLS, AND METHOD FOR DRIVING THE SAME

BACKGROUND OF THE INVENTION

1. Field of the Invention

The present invention relates to a semiconductor memory device, a method for manufacturing the same, a memory circuit, and a method for driving the same, and more particularly, to a single transistor cell, a method for manufacturing the same, a memory circuit composed of the single transistor cells, and a method for driving the memory circuit.

2. Description of the Related Art

A ferroelectric material is a dielectric material in which polarization generated by an external electric field remains partially after removing the external electric field, and the polarization direction can be changed by changing the direction of the external electric field.

Memory devices manufactured using a ferroelectric thin film may be categorized into two types.

The first type of device is a destructive read out (DRO) type memory device, which means that when data is read out, the data is lost from the memory and must be written again. The device is constituted with a capacitor which is manufactured using a ferroelectric thin film dielectric, and a transistor which is used to read or write signals of two directions stored in the capacitor. Here, the memory device is commonly called a ferroelectric random access memory (FRAM), and the driving principle thereof is similar to a dynamic random access memory (DRAM). However, unlike the DRAM, the FRAM requires no refresh and is a nonvolatile memory which keeps stored information even when the power supply is turned off.

The second type of device is a non-destructive read out (NDRO) ferroelectric memory device which reads stored information without destruction, unlike the DRO memory device. The device is obtained by forming a ferroelectric capacitor on the gate electrode of a transistor, and operates by determining whether a channel exists in a silicon surface under a gate oxide layer along a polarization direction of the ferroelectric capacitor. For instance, it is recognized that if a channel exists, 1 is written, and if not, 0 is written.

A memory cell including only a single transistor without a capacitor, unlike the DRAM or FRAM, would be advantageous for integration, but would require an access for selecting a cell or a selection transistor in order to perform random access.

No method for exactly realizing an array of cells each formed of only one transistor of an NDRO type has been disclosed. However, a similar SFRAM is disclosed in U.S. Pat. No. 5,070,385 "Ferroelectric non-volatile variable resistive element" by Evans, Jr., Joseph T. and Bullington, Jeff A.

FIG. 1 is a sectional view of a conventional SFRAM, disclosed in the above patent.

In FIG. 1, reference numeral 10 indicates a gate, which is actually part of, a word line, reference numeral 12 indicates a ferroelectric layer, reference numeral 14 indicates a channel region, reference numeral 16 indicates a drain, reference numeral 18 indicates a source, reference numeral 20 indicates an interdielectric layer, reference numeral 22 indicates a first metal electrode, and reference numeral 24 indicates a second metal electrode.

The SFRAM of FIG. 1 is a thin film transistor (TFT). The word line 10 is formed on a semiconductor substrate (not shown), and the ferroelectric layer 12 is formed on the word line 10. Here, an oxide layer (not shown) is interposed between the word line 10 and the semiconductor substrate. The drain 16 is formed on a left semiconductor layer around the word line 10, and the source 18 is formed on the right semiconductor layer. The channel region 14 is formed between the drain 16 and the source 18 above the word line 10.

When a predetermined voltage is applied to the word line 10, the spontaneous polarization is induced in the ferroelectric layer 12, and thus a conductive channel is formed or not formed in the channel region 14.

For instance, if the source and drain are doped with an N-type impurity, and by a drive method "1" or "0" is written to a cell transistor, then "1" indicates the state in which the conductive channel is formed in the channel region, and "0" indicates the in which no conductive channel is formed. When a positive voltage (+V) is applied to the word line 10, N-type ions are accumulated in the channel region 14 due to the polarization of the ferroelectric layer 12, so that the conductive channel is formed, to thereby write "1" in the cell transistor. When a negative voltage (−V) is applied to the word line 10, P-type ions are accumulated in the channel region 14 due to the polarization of the ferro dielectric layer 12, so that a non-conductive channel is formed, to thereby write "0" in the cell transistor.

Meanwhile, in order to read the data stored in the cell transistor, if +V is applied to the second metal electrode 24 while the conductive channel is formed in the channel region 14, i.e., "1" is written, current passes through the first metal electrode 22, and if a non-conductive channel is formed in the channel region 14, i.e., "0" is written, current does not pass through the first metal electrode 22. Thus, the current passing through the first metal electrode 22 is measured, to thereby read the cell transistor of "1" or "0".

In the conventional SFRAM, read and write are performed by normal drive of the unit cell. However, in order to read or write information in an arbitrary unit cell, each cell requires a further two access transistors, which prevents high integration density for the memory device.

SUMMARY OF THE INVENTION

It is an objective of the present invention to provide a single transistor cell including a unit cell formed of one transistor, capable of random access of the unit cell.

It is another objective of the present invention to provide a method of manufacturing the single transistor cell.

It is still another objective of the present invention to provide a memory circuit formed of single transistor cells, in which a unit cell is formed of one transistor, and which can randomly access the unit cells.

It is yet another objective of the present invention to provide a method for driving the memory circuit.

Accordingly, to achieve the first objective, a single transistor cell according to the present invention comprises an island type semiconductor layer as an active region formed on a ferroelectric layer, a word line crossing the semiconductor layer, a source formed on the semiconductor layer one side of on the word line, and a drain formed on the semiconductor layer on the other side of the word line, a plate line formed below the ferroelectric layer to face the word line, intersecting the word line, a drive line connected to the source, and a bit line connected to the drain.

Here, the plate line is formed of platinum, and the ferroelectric line is formed of one selected from the group consisting of PZT, PLZT, PNZT, PbTiO3 and Y1. the semiconductor layer is formed of an oxide such as $SnO_2$. The word line is formed of a material having a high work function, to reduce leakage current. Also, the word line is formed of either polysilicon doped with impurities or aluminum.

To achieve the second objective, a method for manufacturing a single transistor cell according to the present invention comprises (a) forming a rectangular plate line extending in a first direction, on a semiconductor substrate, (b) forming a rectangular ferroelectric line extending in a second direction perpendicular to the first direction to intersect the plate line, on the resultant structure where the plate line is formed, (c) forming an island type semiconductor layer on the ferroelectric line in a region where the ferroelectric line overlaps the plate line, and (d) forming a rectangular word line extending in the second direction to cross the semiconductor layer.

A reaction preventing layer is formed before forming the plate line, to suppress reaction of the semiconductor substrate with the ferroelectric line. The reaction preventing layer is formed of $TiO_2$.

Forming the plate line comprises the substeps of depositing Pt on the entire surface of the semiconductor substrate, and photo etching the Pt to form the plate line extending in the first direction.

Forming the ferroelectric line comprises the substeps of depositing ferroelectric material on the entire surface of the resultant structure where the plate line is formed, by either a sol-gel coating method or a sputtering method, and photo etching the ferroelectric material to form the ferroelectric line, extending in the second direction perpendicular to the first direction and intersecting the plate line. The ferroelectric material is either PZT, PLZT, PNZT, $PbTiO_3$ or Y1.

Forming the semiconductor layer comprises the substeps of forming $SnO_2$ on the entire surface of the resultant structure where the ferroelectric line is formed, implanting In ions into the $SnO_2$ layer, and photo etching the in-implanted $SnO_2$ layer to form an island type semiconductor layer in a region where the plate line overlaps the ferroelectric line. The semiconductor layer is formed of an oxide.

Forming the word line comprises the substeps of forming an oxide layer on the entire surface of the substrate where a semiconductor layer is formed, forming a conductive material on the oxide layer, and photo etching the conductive material and the oxide layer to form the rectangular word line across the semiconductor layer.

After forming the word line, impurity ions are implanted on the entire surface of the substrate of the resultant structure where the word line is formed, to form a source and a drain on the semiconductor layer to the right and left of the word line, a first interdielectric layer is formed on the entire surface of the substrate where the source and drain are formed, the first interdielectric layer is selectively etched to form a first contact window partially exposing the source, a drive line is formed connected to the source through the first contact window, on the first interdielectric layer, a second interdielectric layer is formed on the entire surface of the substrate of the resultant structure where the drive line is formed, the first and second interdielectric layers are selectively etched to form a second contact window partially exposing the drain, and a bit line is formed connected to the drain through the second contact window, on the second interdielectric layer.

To achieve the third objective, in a memory circuit formed of single transistor cells according to the present invention, a source of a first cell transistor and a source of a second cell transistor are connected in common to a drive line, a drain of the first cell transistor is connected to a first bit line, a drain of the second cell transistor is connected to a second bit line, a gate of the first cell transistor is connected to a first word line, a gate of the second cell transistor is connected to a second word line, and ferroelectric layers of the first and second cell transistors are in connected in common to a plate line.

Here, the unit circuit shares the plate line with other unit circuits horizontally adjacent to the unit circuit, shares a drain of an odd-numbered horizontally adjacent cell transistor with the first bit line, a drain of an even-numbered horizontally adjacent cell transistor with the second bit line, shares the drive line with vertically adjacent unit circuits, shares the first word line with a gate of odd-numbered cell transistors of vertically adjacent unit circuits, and shares the second word line with a gate of even-numbered cell transistors of vertically adjacent unit circuits.

To achieve the fourth objective, in a method for driving a memory circuit according to the present invention, in order to write "1" to an arbitrary cell, a voltage V is applied to a plate line connected to a ferroelectric layer, a word line connected to a gate of a cell transistor facing the ferroelectric layer is grounded, a drive line connected to a source of the cell transistor and a bit line connected to a drain of the cell transistor are floated. In order to write "0" to an arbitrary cell, a voltage V is applied to the plate line, a voltage V is applied to the word line, and the drive line and the bit line are floated. Here, a word line, a drive line and a bit line of a cell requiring no write, which shares a plate line with the arbitrary cell, are floated. In order to read data stored in an arbitrary cell, a voltage V is applied to the drive line and a current induced in the bit line is measured. Here, all drive lines except a drive line connected to a cell requiring read are floated, in order to read the data stored in an arbitrary cell.

If "1" is written to an arbitrary cell, a voltage −V is applied to the word line to increase the difference in electric potential between the word line and the plate line, and if "0" is written to an arbitrary cell, a voltage −V is applied to the plate line to increase the difference in electric potential between the word line and the plate line. Also, a voltage of ⅓ Vcc~½ Vcc is applied to the word line to increase an on-current of the cell.

Thus, the plate line intersects the word line, and the ferroelectric layer and the semiconductor layer are interposed between the plate line and the word line, so that information is written to or read from an arbitrary unit cell, and the drive line intersects the bit line, increasing a data sensing margin.

BRIEF DESCRIPTION OF THE DRAWINGS

The above objectives and advantages of the present invention will become more apparent by describing in detail a preferred embodiment thereof with reference to the attached drawings in which:

FIGS. 4A through 9A and 4B though 9B are sectional views illustrating a method for manufacturing a single transistor cell according to the present invention. The "A" figures show sections taken along line AA' of FIG. 3, and the "B" figures show sections taken along line BB' of FIG. 3;

DESCRIPTION OF THE PREFERRED EMBODIMENTS

Single Transistor Cell

Figure 1:
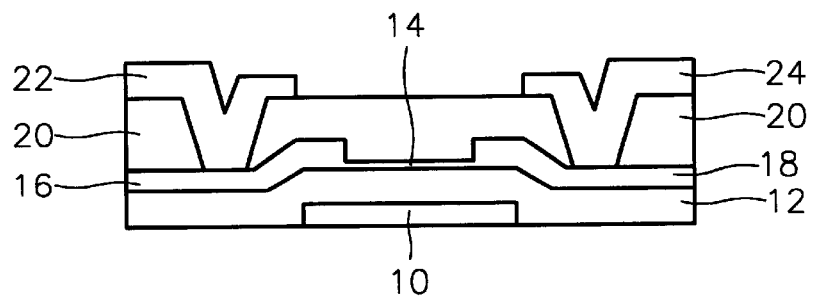
FIG. 1 is a sectional view of a conventional static ferroelectric random access memory (SFRAM) device.
Figure 2:
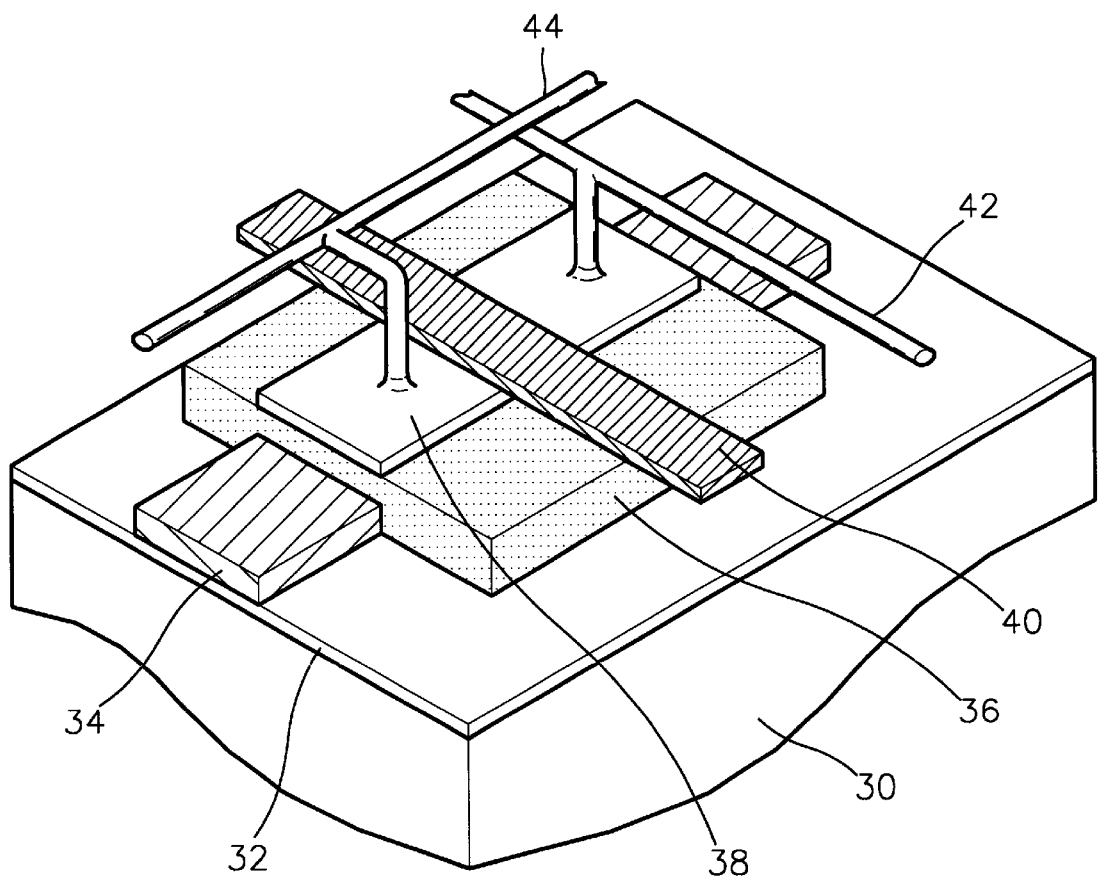
FIG. 2 is a perspective view of a single transistor memory cell according to the present invention.

Referring to FIG. 2, reference numeral 30 denotes a semiconductor substrate, reference numeral 32 denotes a reaction preventing layer, reference numeral 34 denotes a plate line, reference numeral 36 denotes a ferroelectric line, reference numeral 38 denotes a semiconductor layer, reference numeral 40 denotes a word line, reference numeral 42 denotes a drive line and reference numeral 44 denotes a bit line.

The single transistor cell according to the present invention includes the bar type plate line 34 of a first direction (from the bottom left to the top right of FIG. 2), the bar type ferroelectric line 36 of a second direction (from the top left to the bottom right of FIG. 2), which is perpendicular to the first direction, the semiconductor layer 38 formed on the ferroelectric line 36, overlapping the plate line 34, the bar type word line 40 of the second direction formed on the semiconductor layer 38 and formed across the semiconductor layer 38, a source (not shown) formed in the semiconductor layer 38 on one side of the word line 40, a drain (not shown) formed in the semiconductor layer 38 on the other side of the word line 40, the drive line 42 connected to one side of the semiconductor layer, and the bit line 44 connected to the other side of the semiconductor layer.

The bit line 44 is positioned above the drive line 42. The plate line 34 is formed of platinum (Pt), the ferroelectric line 36 is formed of PZT, PLZT, PNZT, PbTiO$_3$ or Y1, the semiconductor layer 38 is formed of an oxide such as SnO$_2$, and the word line 40 is formed of a material having a high work function, e.g., polysilicon doped with an impurity or aluminum, in order to reduce leakage current. The ferroelectric line 36 has a planarized surface.

According to the single transistor cell of the present invention, the bar type plate line 34 extending in the first direction and the bar type word line 40 extending in the second direction read or write information from or to an arbitrary unit cell. The ferroelectric line 36 and the semiconductor layer 38 are interposed between the plate line 34 and the word line 40. A method of driving the memory circuit will be described later.

Also, the drive line 42 and the bit line 44 are perpendicular to each other, to prevent the data sensing margin from being reduced due to interference between adjacent lines during reading of information. That is, if the drive line 42 and the bit line 44 were parallel with each other on the same layer (as in the conventional art), leakage current flows in an arbitrary turned-off line due to interference from a turned-on adjacent line, lowering the data sensing margin. In the present invention the bit line 44 is formed on a different layer from the drive line 42, to suppress the interference phenomenon.

The island type semiconductor layer 38 is formed on a region where the plate line 34 and the word line 40 overlap, and two transistors sharing the source are formed in an arbitrary semiconductor layer electrically isolated from the other semiconductor layer (a transistor is shown in FIG. 2).

The two transistors formed on the isolated semiconductor layer 38 are electrically affected by the same plate line 34, but by different word lines, which allows information to be arbitrarily written in a unit cell. Also, when reading, the sources of the two transistors formed on the isolated semiconductor layer 38 are electrically affected by the same drive line 42, but by different bit lines connected to each drain, which allows information to be arbitrarily read from the unit cell.

In FIG. 2, the reaction preventing layer 32 prevents direct contact between the semiconductor substrate 30 and the ferroelectric line 36, to thereby suppress chemical reaction therebetween, and is formed of a metal oxide such as a TiO$_2$.

Figure 3:
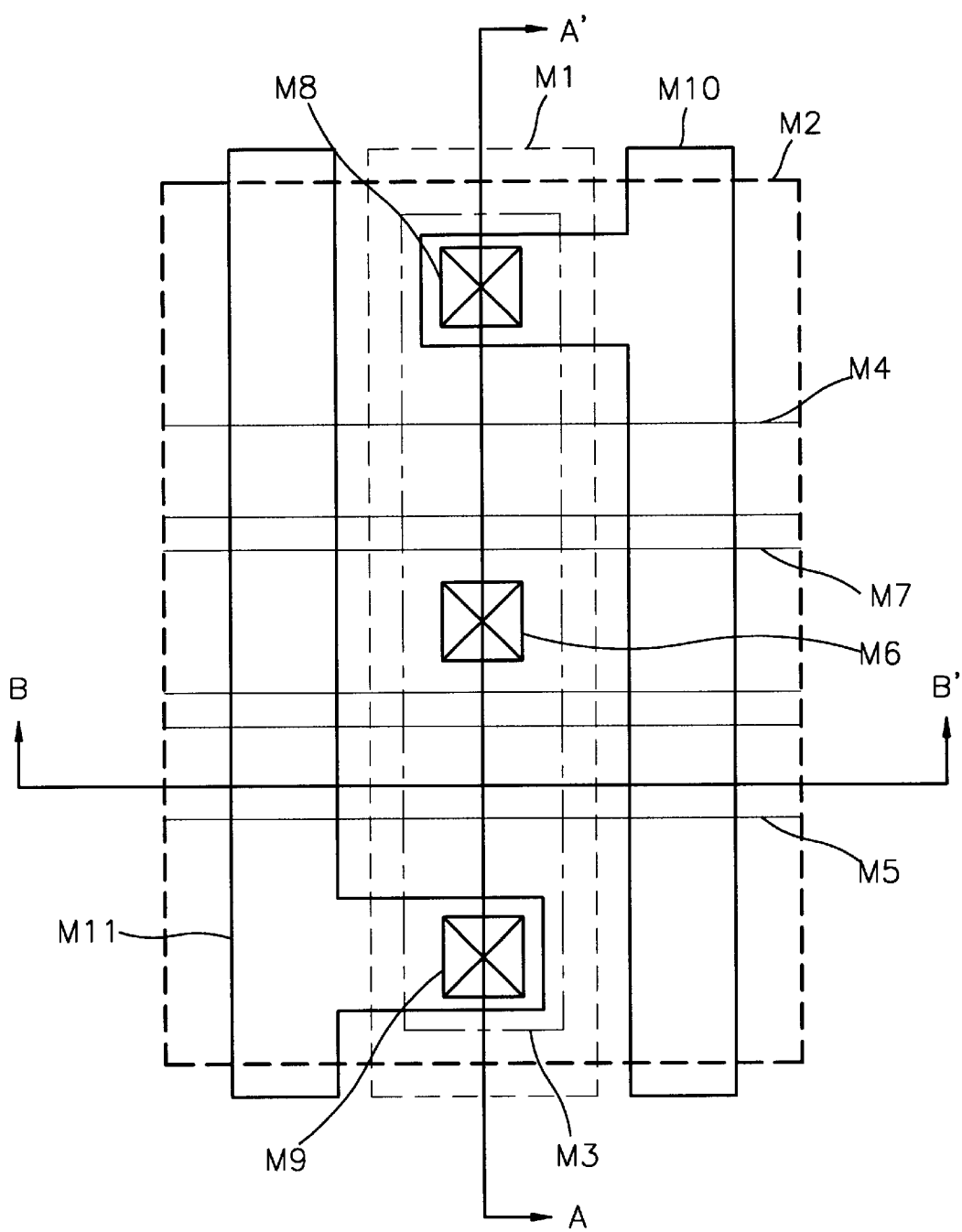
FIG. 3 is a plan view of mask patterns required to form a single transistor cell according to the present invention.

In FIG. 3, M1 denotes a mask pattern for forming a plate line, M2 denotes a mask pattern for forming a ferroelectric line, M3 denotes a mask pattern for forming a semiconductor layer, M4 and M5 denote mask patterns for forming first and second word lines, M6 denotes a mask pattern for forming a contact window partially exposing sources of first and second cell transistors, M7 denotes a mask pattern for forming a drive line, M8 and M9 denote mask patterns for forming a contact window partially exposing drains of first and second cell transistors, and M10 and M11 denote mask patterns for forming first and second bit lines.

M1 is a rectangular shape and is arranged in the first direction, i.e., the vertical direction in FIG. 3, and M2 is a rectangular shape and is arranged in the second direction perpendicular to the first direction, i.e., the horizontal direction in FIG. 3. M3 is a rectangular shape and is arranged in the first direction in a region where M1 and M2 overlap each other. M4 and M5 are rectangular shapes and are arranged on both sides of M6. M6 is arranged between M4 and M5 and in the center of M3. M7 is a rectangular shape and is arranged in the second direction between M4 and M5 to include M6. M8 faces M6, and M4 is interposed between M8 and M6. M9 faces M6, and M5 is interposed between M9 and M6. M10 is a rectangular shape and is arranged in the first direction having a protrusion including M8. M11 is a rectangular shape and is arranged in the first direction having a protrusion including M9.

In FIG. 3, mask patterns of the same line type represent patterns formed in one mask. In other words, the mask patterns of the same line type represent patterns formed on one layer by a photolithography process with respect to a semiconductor substrate. For instance, M10 and M11 exist in one mask, and first and second bit lines are formed in one layer by photolithography using that mask.

Manufacturing Method

Figure 4A:
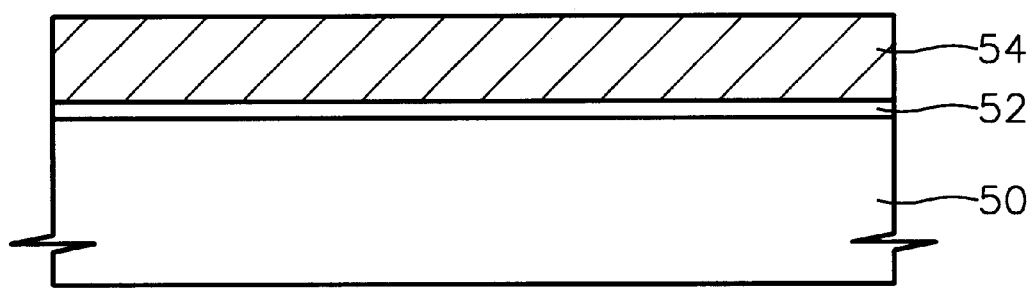
Figure 4B:
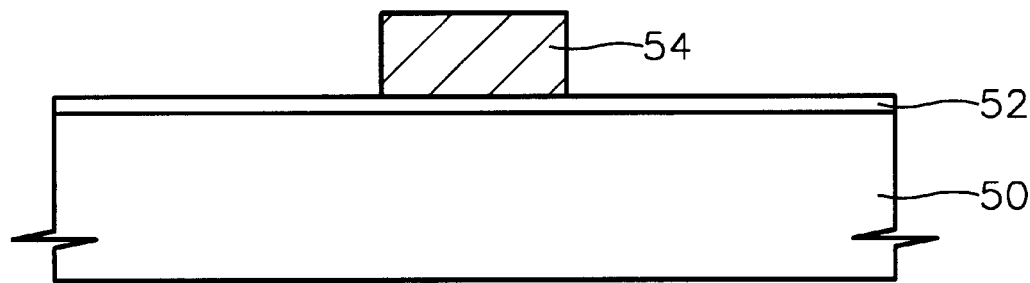

FIGS. 4A and 4B illustrate a process of forming a plate line 54. The process includes the steps of forming a reaction preventing layer 52 on a semiconductor substrate 50, and forming the bar type plate line 54 extending in the first direction, (which is the horizontal direction of the "A" figures, FIGS. 4A through 9A) on the reaction preventing layer 52.

The reaction preventing layer 52 is a layer e.g., a metal oxide layer such as TiO$_2$, for preventing chemical reaction of a ferroelectric line, to be formed later, with the semiconductor substrate 50. For instance, if the ferroelectric layer formed of PZT directly contacts the semiconductor substrate, Pb of the PZT combines with silicon (Si) particles of the semiconductor substrate, at an interface between the ferroelectric layer and the semiconductor substrate to form PbSi$_x$. The reaction preventing layer 52 prevents chemical combination to suppress the formation of PbSi$_x$.

The plate line 54 is formed by depositing a conductive material such as Pt on the entire surface of the reaction preventing layer 52, and etching the conductive material using the mask pattern M1 of FIG. 3.

Figure 5A:
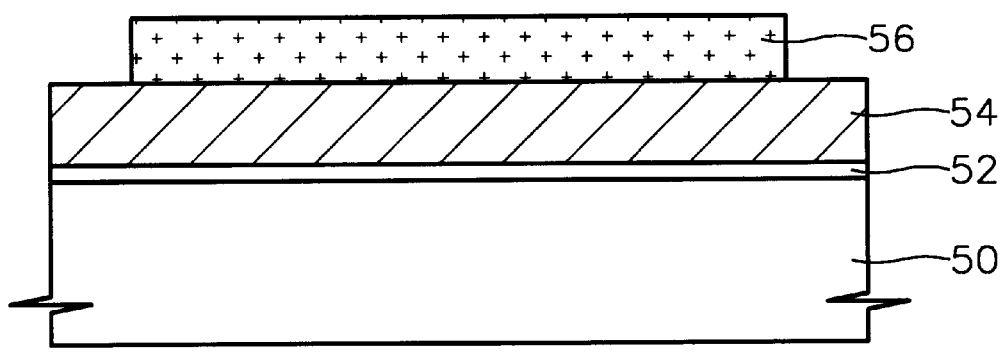
Figure 5B:
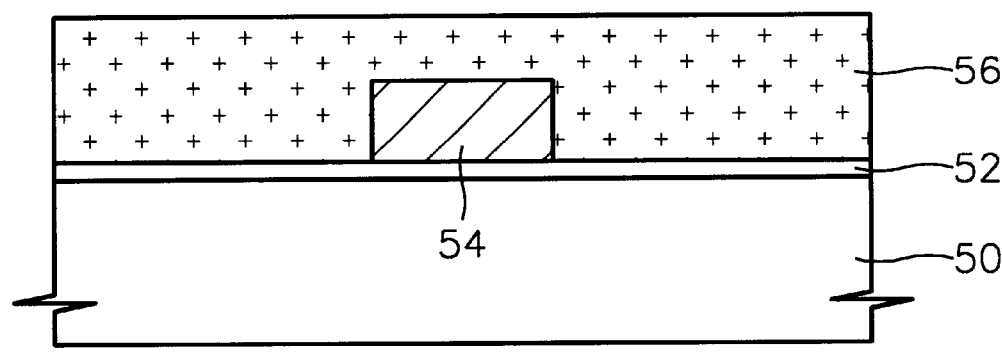

FIGS. 5A and 5B illustrate a process of forming the ferroelectric line 56. The process includes the steps of forming a ferroelectric layer on the entire surface of the substrate where plate line 54 is formed, and photo etching the ferroelectric layer to form the rectangular ferroelectric line 56 extending in the second direction perpendicular to the first direction, i.e., perpendicular to the picture plane of "A" figures, FIGS. 4A through 9A.

The ferroelectric layer is formed by sol-gel coating or sputtering a ferroelectric material such as PZT, PLZT, PNZT, $PbTiO_3$ or Y1, and the photo etching is performed using a mask pattern M2 of FIG. 3. The ferroelectric layer has a planarized surface formed on the entire surface of the substrate.

Figure 6A:
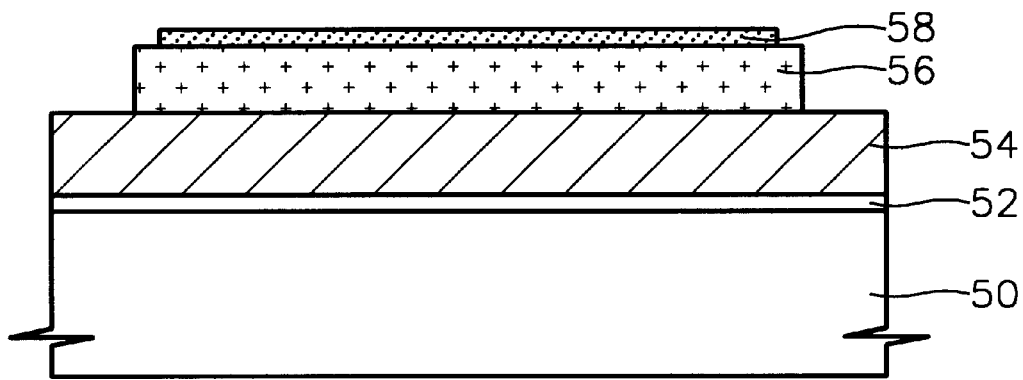
Figure 6B:
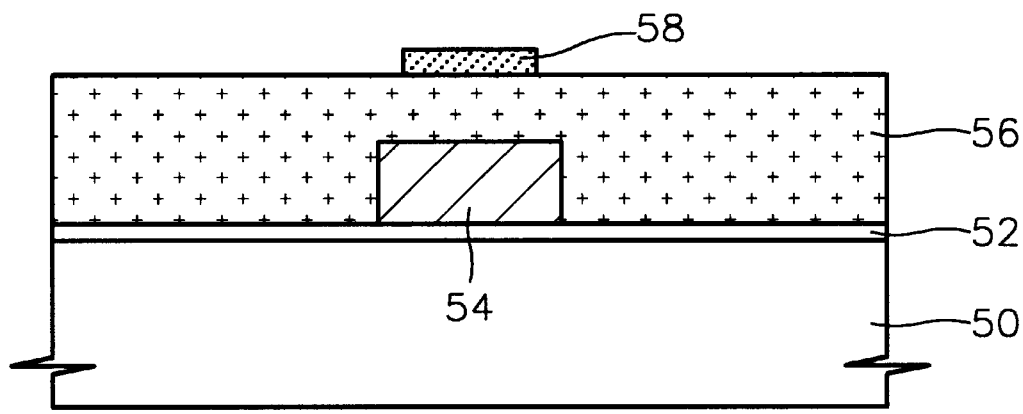

FIGS. 6A and 6B illustrate a process of forming the semiconductor layer 58. The process includes the steps of forming an oxidation semiconductor layer on the entire surface of the substrate where the ferroelectric line 56 is formed, implanting impurity ions to polarize the oxide layer, and photo etching the oxide layer to form the semiconductor layer 58 of an isolated island in a region where the plate line 54 overlaps the ferroelectric line 56.

The oxide semiconductor is formed of $SnO_2$, and the impurity ions are indium (In) ions. The photolithography is performed using the mask pattern M3 of FIG. 3.

Figure 7A:
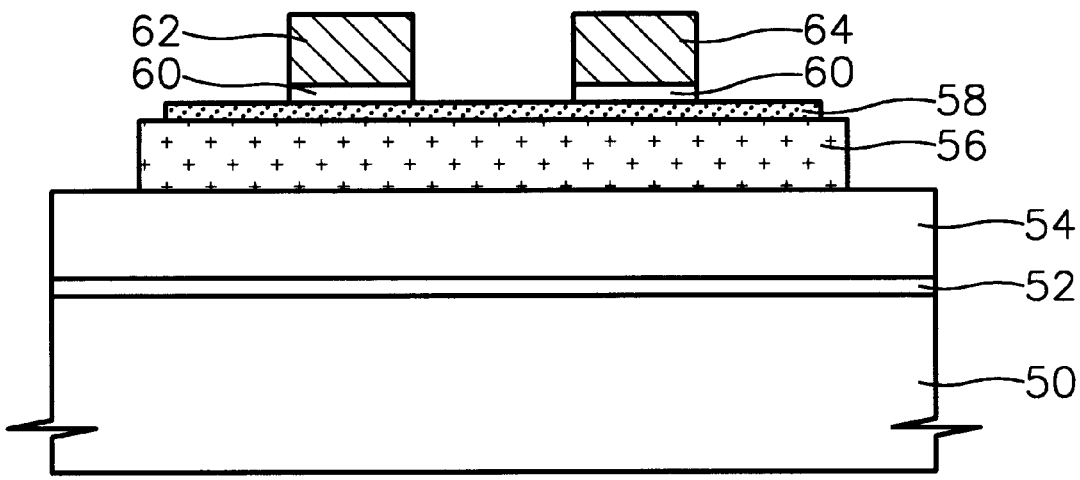
Figure 7B:
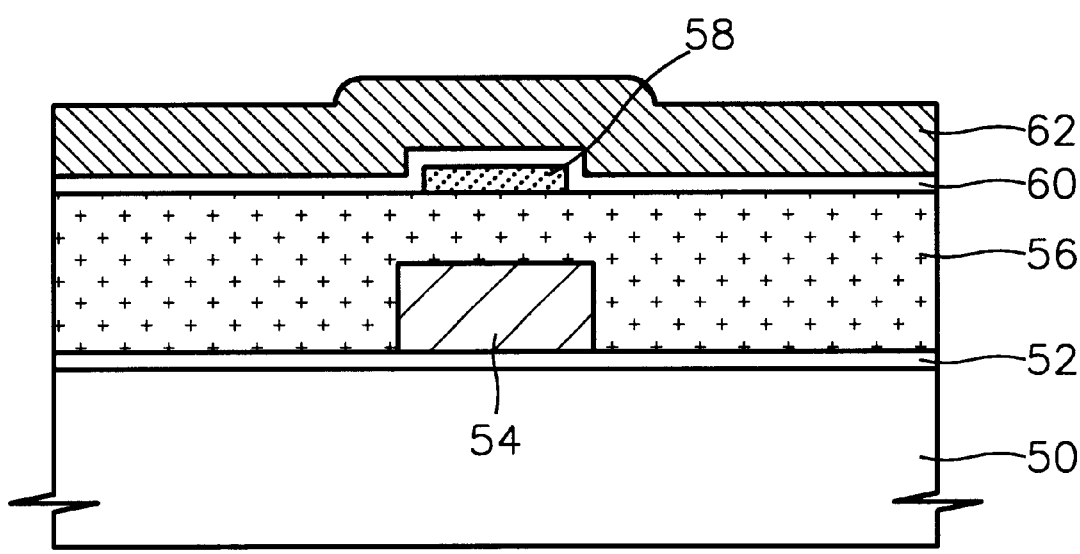

FIGS. 7A and 7B illustrate a process of forming first and second word lines 62 and 64. The process includes the steps of forming a thin oxide layer 60 on the entire surface of the substrate where the semiconductor layer 58 is formed, forming a conductive material layer on the thin oxide layer 60, and simultaneously photo etching the conductive material layer and the thin oxide layer to form the rectangular first and second word lines 62 and 64 extending in the second direction.

The thin oxide layer is a gate dielectric layer formed of, for example, $Al_2O_3$, by a coating method such as atomic layer deposition (ALD), to realize a low thermal budget and a high quality layer.

Also, the conductive material for forming the first and second word lines 62 and 64, e.g., polysilicon doped with impurities or a material having a high work function such as aluminum, is for reducing leakage current between the first and second word lines 62 and 64 and the semiconductor layer 58. The photolithography is performed using mask patterns M4 and M5 of FIG. 3. The mask pattern M4 forms the first word line 62, and the mask pattern M5 forms the second word line 64. The first word line 62 is for the first cell transistor, and the second word line 64 is for the second cell transistor.

Figure 8A:
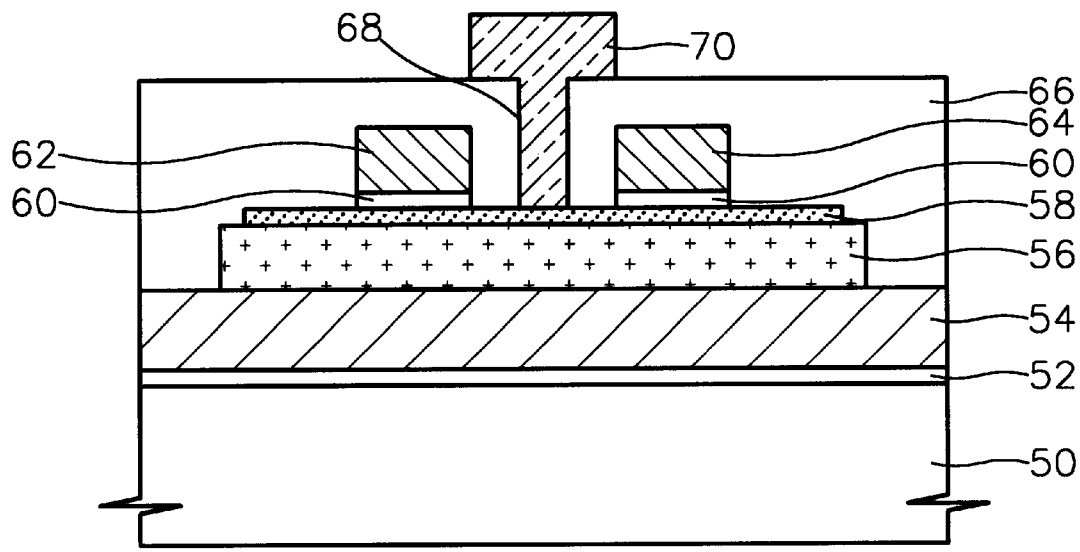
Figure 8B:
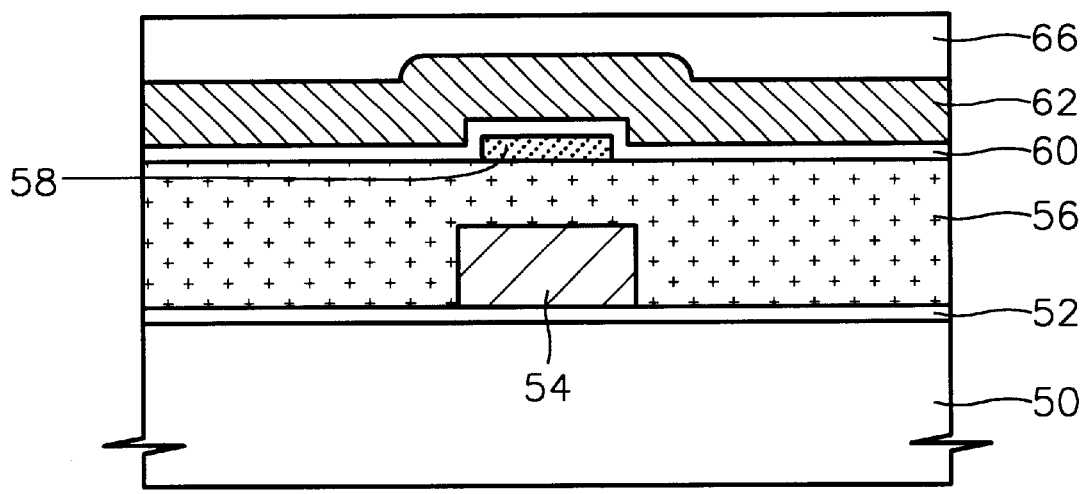

FIGS. 8A and 8B illustrate a process of forming a drive line 70. The process includes the steps of implanting impurity ions into the entire surface of the substrate where the first and second word lines 62 and 64 are formed to form sources and drains (not shown) of the first and second cell transistors in semiconductor layers on both sides of the first and second word lines 62 and 64, coating the insulating material on the entire surface of the substrate to form a first interdielectric layer 66, selectively etching the first interdielectric layer 66 to form a first contact window 68 partially exposing the source, depositing conductive material to completely fill the first contact window 68, and patterning the resultant structure to form the rectangular drive line 70 extending in the second direction.

At this time, the source and drain of the first cell transistor are formed to the right and left respectively of the first word line 62 of FIG. 8A, and the source and drain of the second cell transistor are formed to the left and right respectively, of the second word line 64. The first and second cell transistors share the same source.

Also, since the surface of the ferroelectric line 56 is planarized, the surface of the first interdielectric layer 66 is flat without requiring planarization.

In FIG. 8A, the first contact window 68 is formed by photolithography using the mask pattern M6 of FIG. 3, and the drive line 70 is formed by photolithography using the mask pattern M7 of FIG. 3.

Figure 9A:
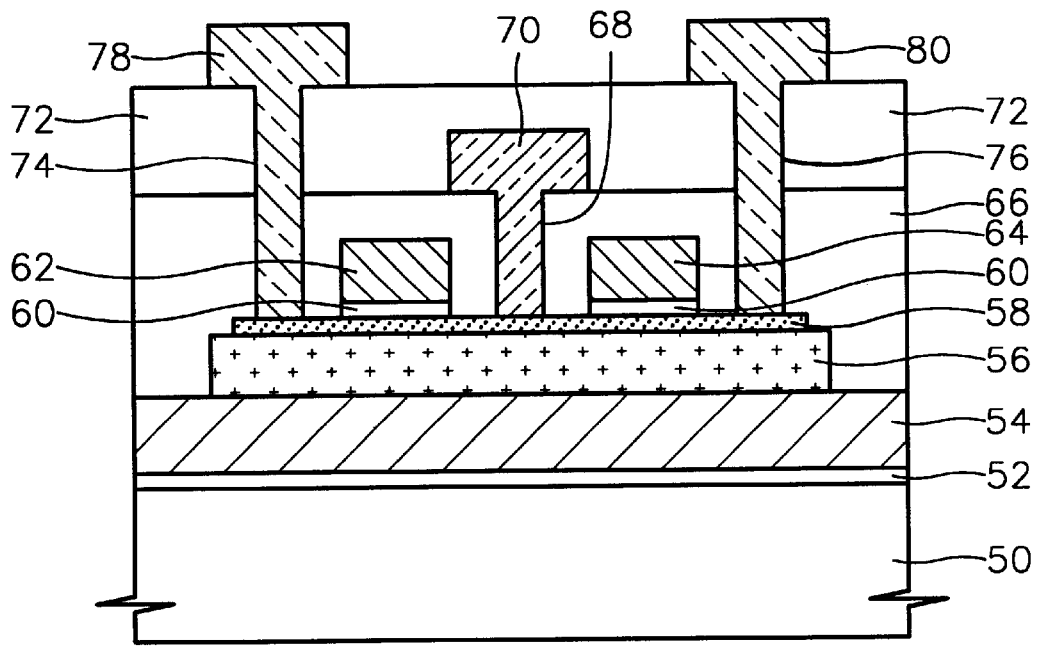
Figure 9B:
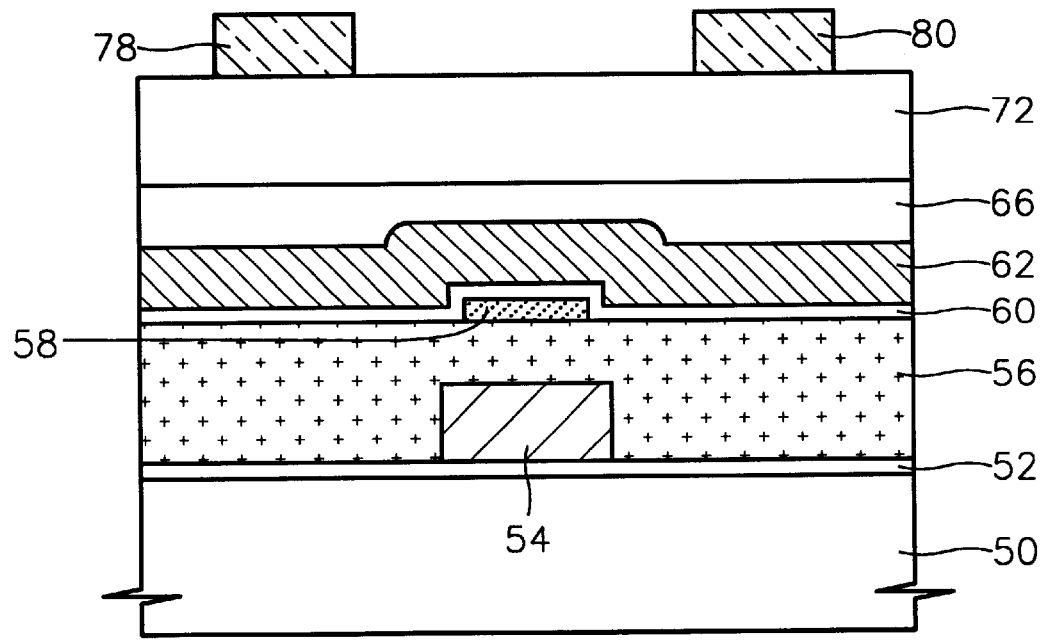

FIGS. 9A and 9B illustrate a process of forming first and second bit lines 78 and 80. The process includes the steps of coating an insulating material on the entire surface of the substrate where the drive line 70 is formed, to form a second interdielectric layer 72, selectively etching the second and first interdielectric layers 72 and 66 to form second and third contact windows 74 and 76 partially exposing the drains of the first and second cell transistors, depositing a conductive material to completely fill the second and third contact windows 74 and 76, and patterning the resultant structure where the conductive material is deposited, to form a rectangular first bit line 78 in the first direction contacting the drain of the first cell transistor through the second contact window 74, and a rectangular second bit line 80 in the second direction contacting the drain of the second cell transistor through the third contact window 76.

Since the ferroelectric line 56 is planarized, the surfaces of the first and second bit lines 78 and 80 are flat without requiring planarization. The second and third contact windows 74 and 76 are formed by photolithography using mask patterns M8 and M9 of FIG. 3 respectively, and the first and second bit lines 78 and 80 are formed by photolithography using mask patterns M10 and M11 of FIG. 3, respectively.

The rectangular drive line 70 is formed in the second direction, and the rectangular first and second bit lines 78 and 80 are formed in the first direction, intersecting the drive line 70.

Memory Circuit

Figure 10:
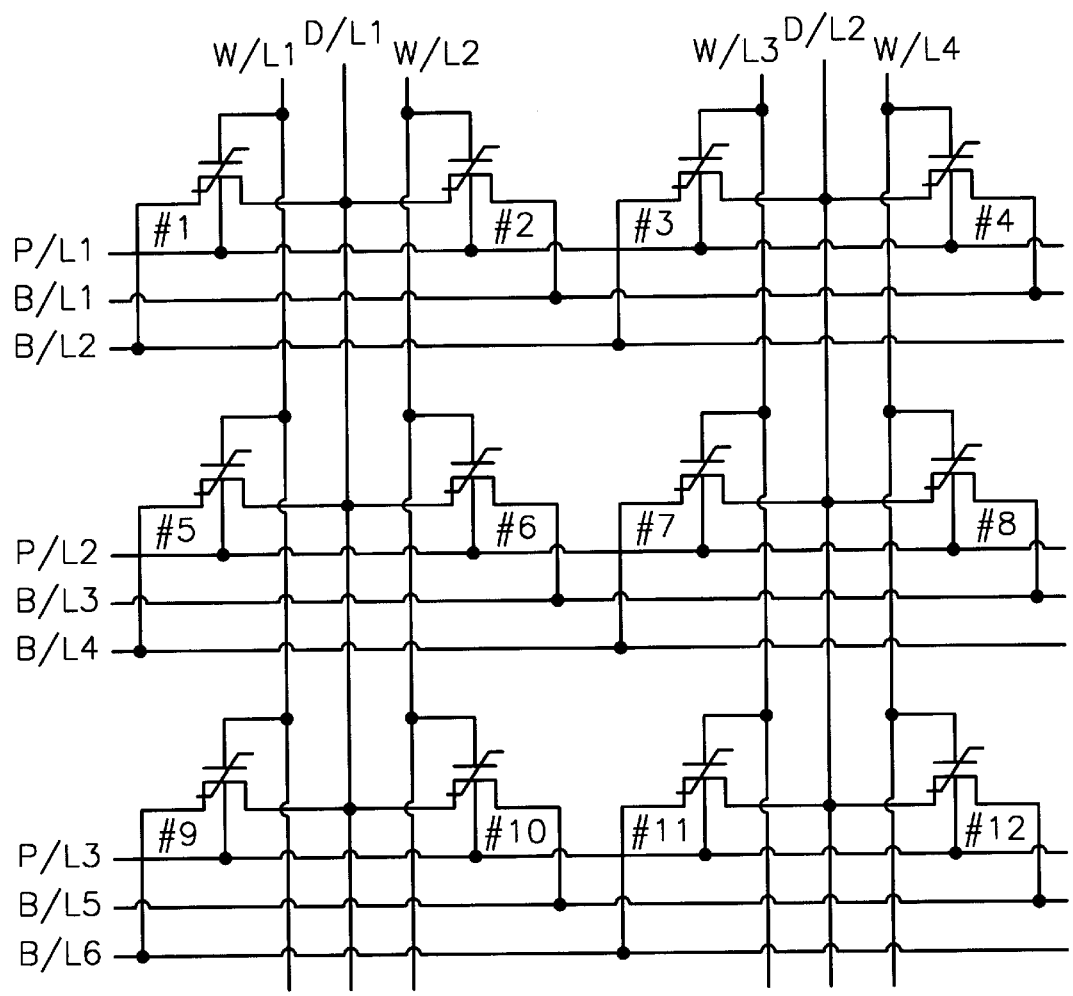
FIG. 10 is a circuit diagram of a memory composed of single transistor cells according to the present invention.

FIG. 10 is a memory circuit composed single transistor cells according to the present invention.

A unit circuit has sources of first and second cell transistors #1 and #2 connected in common to a first drive line D/L1, a drain of the first cell transistor #1 connected to the second bit line B/L2, a drain of the second cell transistor #2 connected to the first bit line B/L1, a gate of the first cell transistor #1 connected to the first word line W/L1, a gate of the second cell transistor #2 connected to the second word line W/L2, ferroelectric layers of the first and second cell transistors #1 and #2 connected in common to the first plate line P/L1. Such unit circuits are arranged to form the cell array.

At this time, the unit circuit shares the first plate line P/L1 with other horizontally adjacent unit circuits, for instance, a unit circuit including the third and fourth cell transistors #3 and #4, a drain of an odd-numbered horizontally adjacent cell transistor, for instance, of the third cell transistor #3, with the second bit line B/L2, a drain of an even-numbered horizontally adjacent cell transistor, for instance, of the fourth cell transistor #4, with the first bit line B/L1, the first drive line D/L1 with vertically adjacent unit circuits, for instance, the fifth and sixth cell transistors #5 and #6, the first word line W/L1 with a gate of an odd-numbered cell transistor of vertically adjacent unit circuits, for instance, the fifth cell transistor #5, and the second word line W/L2 with a gate of an even-numbered cell transistor of vertically adjacent unit circuits, for instance, the sixth cell transistor #6.

Method for Driving a Memory Circuit Write

Write

If "1" (the state in which a conductive channel is formed) is to be written to the first cell transistor #1, a voltage V is applied to the first plate line P/L1, the first word line W/L1 is grounded, and the first drive line D/L1 and the second bit line B/L2 are floated. If "0" (the state in which no conductive channel is formed) is written to the first cell transistor #1, the voltage V is applied to the first plate line P/L1, a voltage +V is applied to the first word line W/L1, and the first drive line D/L1 and the second bit line B/L2 are floated.

At this time, a word line, a bit line and a drive line of other cell transistors which require no write, e.g., one or more of second, third and fourth cell transistors #2, #3 and #4 which share the first plate line P/L1 with the first cell transistor #1, are floated.

A memory circuit according to the present invention performs writing in a row unit, which is the alignment of cell transistors sharing an arbitrary plate line. For instance, in FIG. 10, arbitrary information is written to first, second, third and fourth cell transistors #1, #2, #3 and #4, and then information is written to cell transistors forming another row. At this time, the row where information is written is selected by applying a predetermined voltage to the plate line P/L.

For instance, in order to write 1, 0, X, and 1 to the first, second, third and fourth cell transistors #1, #2, #3 and #4, the voltage V is applied to the first plate line P/L1 to select the first row, and other plate lines, e.g., second and third plate lines P/L2 and P/L3, are floated. The first word line W/L1 is grounded, the voltage +V is applied to the second word line W/L2, the third word line W/L3 is floated, and the fourth word line W/L4 is grounded. At this time, the first and second bit lines B/L1 and B/L2 and the first and second drive lines D/L1 and D/L2 are floated.

If 1 is written to the cell transistor, the voltage −V is applied instead of grounding the word line W/L, in order to increase to electric potential between the word line W/L and the plate line P/L, and if 0 is written to the cell transistor, −V instead of V is applied to the plate line P/L in order to increase the electric potential between the word line W/L and the plate line P/L.

Also, on-current of the cell transistor is reduced or leakage current of off-state is increased due to remnant Polarization (Pr), coercive voltage (Vc) and interface defect, so that the on/off current ratio is reduced to reduce a sensing margin, and a voltage of ⅓~½ V is applied to the word line W/L to thereby increase on-current.

As described above, a row to be written is selected by applying a voltage to an arbitrary plate line, and then the state of each word line arranged in the row is changed to perform the write to a row unit. However, a column to be written to may be selected by applying a voltage to an arbitrary word line, and then the state of each plate line in the column may be changed to perform the write to a column unit. At this time, bit lines, drive lines and plate lines requiring no information to be written are floated.

Read

In order to read information stored in the first cell transistor #1, current induced in the second bit line B/L2 is detected by applying a voltage V to the first drive line D/L1. At this time, other drive lines, e.g., the second drive line D/L2 but not the first drive line D/L1 connected to the first cell transistor #1, are floated.

If on-current is detected in the second bit line B/L2, it is determined that 1 is stored in the first cell transistor #1, if off-current is detected in the second bit line B/L2, it is determined that 0 is stored in the first cell transistor #1, and if no current is detected in the second bit line B/L2, it is determined that nothing is stored in the first cell transistor #1.

At this time, the information stored in the second cell transistor #2 connected in common to the first drive line D/L1 is read by the first bit line B/L1, so that the information stored in the first cell transistor #1 and the information stored in the second cell transistor #2 can be selectively read.

For instance, if 0, 1, 1, 0, X and 1 are stored in the third, fourth, seventh, eighth, eleventh and twelfth cell transistors #3, #4, #7, #8, #11 and #12, and the voltage V is applied to the second drive line D/L2, off-current and on-current are detected in the second and first bit lines of the first row, on-current and off-current are detected in the fourth and third bit lines of the second row, and on-current is not detected in the sixth bit line but is detected in the fifth bit line of the third row. Thus, it can be understood that 0, 1, 1, 0, X and 1 are stored in the third, fourth, seventh, eighth, eleventh and twelfth cell transistors #3, #4, #7, #8, #11 and #12, respectively.

Figure 11:
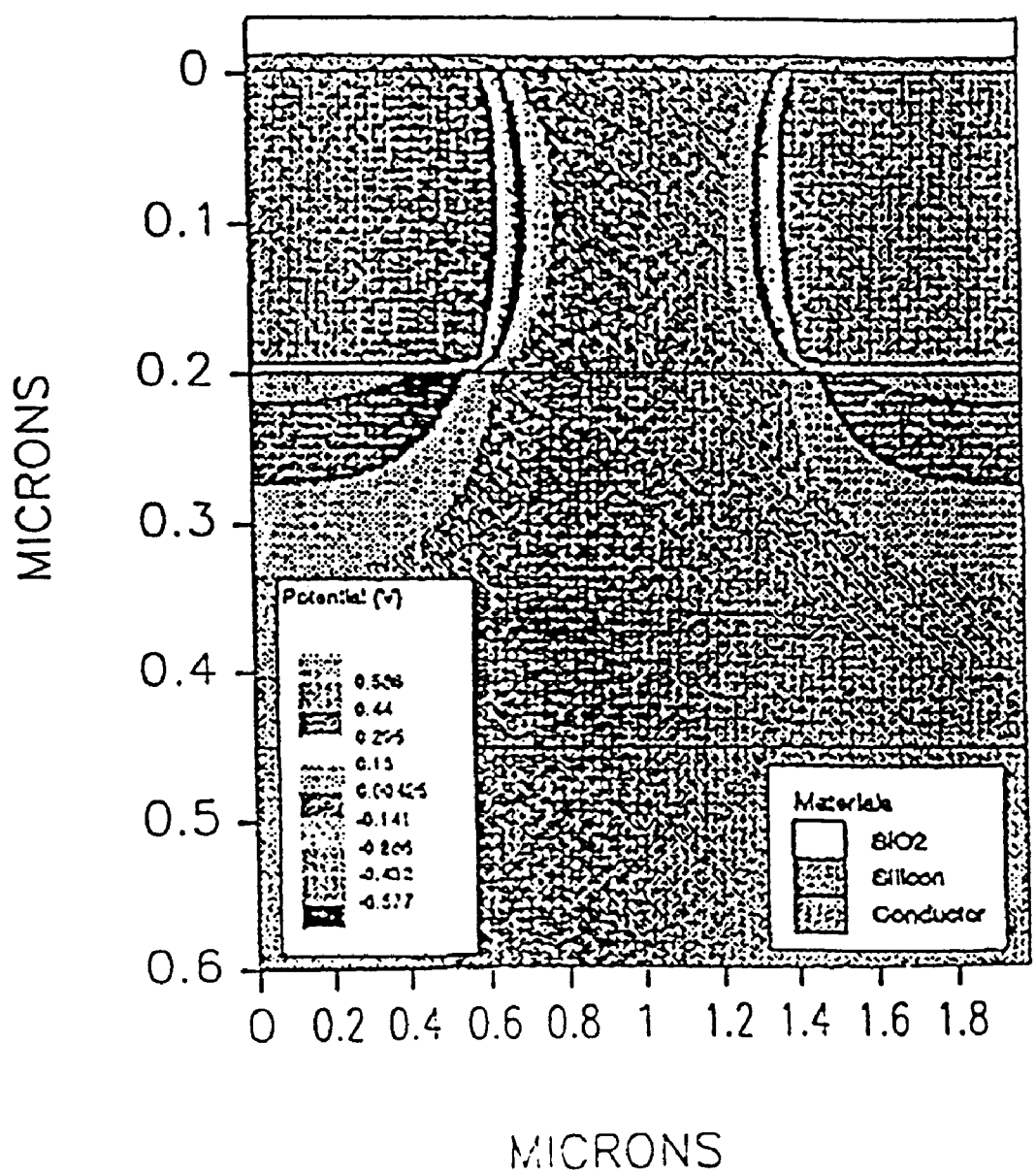
FIG. 11 is a potential contour diagram of an FRAM according to the present invention.

FIG. 11 shows the potential contour of an FRAM according to the present invention before a bias is applied to each electrode.

An electrode having a high work function of 5.3 was employed on and under the semiconductor layer.

The electric potential at the center of the semiconductor layer is increased and a conductive channel is formed toward a bulk, which lowers the off-current. Since defect density at an interface between the semiconductor layer and the ferroelectric layer is increased, it is preferable that a path of leakage current in the initial state is formed toward the bulk. This can be also employed in the case when polysilicon is used as a word line to allow easy etching.

Figure 12:
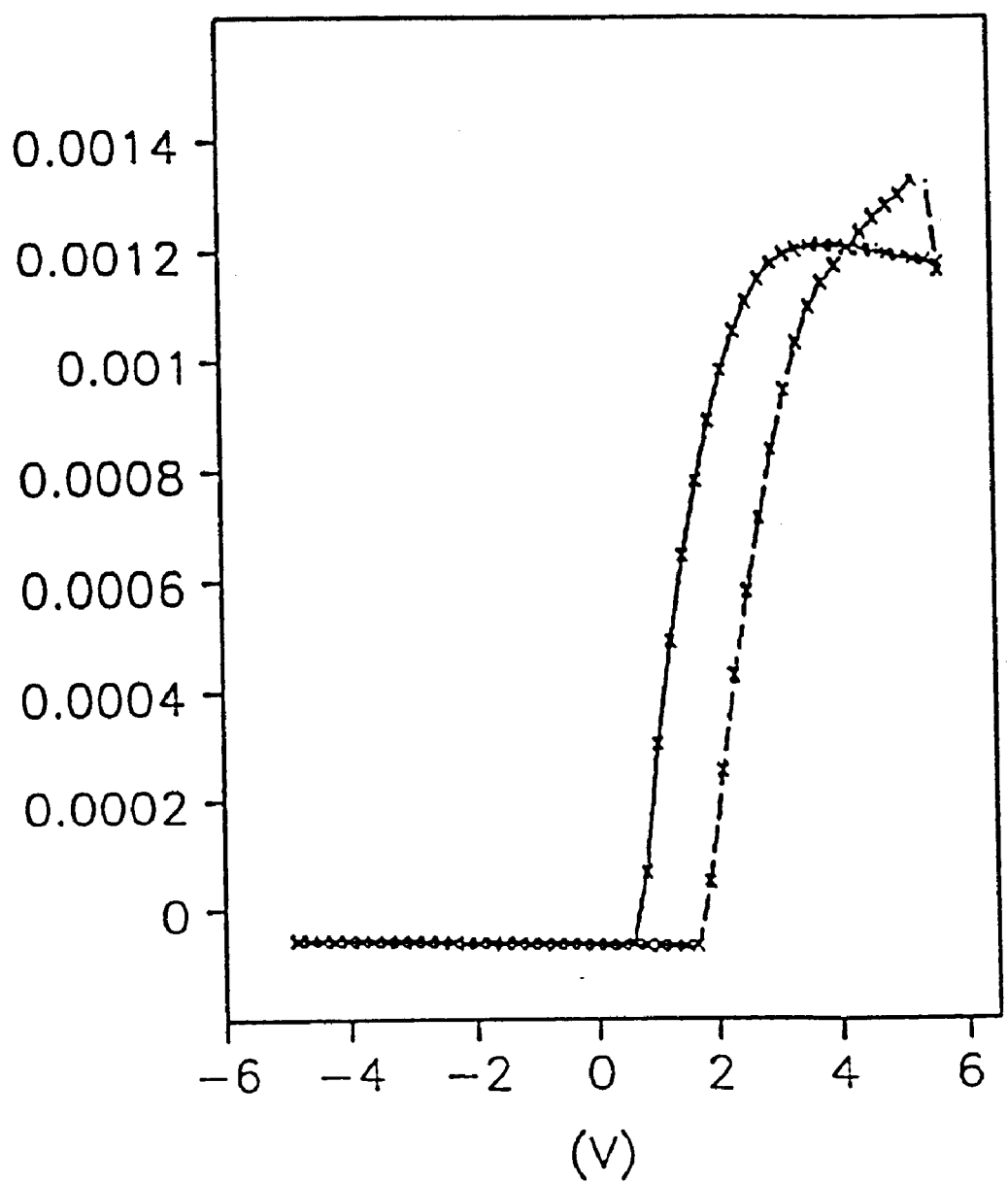
FIG. 12 is a graph of drain current (Id) versus gate voltage (Vg) of an FRAM according to the present invention.

Referring to FIG. 12, it is understood that a memory window of 1 V or more can be obtained.

According to the present invention, one transistor forms a unit cell and requires no additional transistors, random access is possible, and a data sensing margin can be increased. Also, a process of manufacturing and using a memory cell can be simplified.

It should be understood that the invention is not limited to the illustrated embodiment and that many changes and modifications can be made within the scope of the invention by a person skilled in the art.

What is claimed is:

1. A single transistor cell comprising:
   a rectangular plate line extending in a first direction;
   a rectangular ferroelectric line extending in a second direction perpendicular to the first direction, and formed on the plate line;
   an island type semiconductor layer formed on the ferroelectric line in a region where the ferroelectric line and the plate line overlap each other; and
   a rectangular word line extending in the second direction, and formed on and across the semiconductor layer.

2. The single transistor cell of claim 1, further comprising:
   a drive line connected to the semiconductor layer on a first side of the word line; and
   a bit line connected to the semiconductor layer on a second side of the word line.

3. The single transistor cell of claim 2, further comprising:
   a source formed on the semiconductor layer on the first side; and
   a drain formed on the semiconductor layer on the second side.

4. The single transistor cell of claim 2, wherein the drive line crosses the bit line.

5. The single transistor cell of claim 4, wherein the bit line is positioned above the drive line.

6. The single transistor cell of claim 1, wherein the plate line is formed of platinum, and the ferroelectric line is formed of one selected from the group consisting of PZT, PLZT, PNZT, PbTiO$_3$ and Y1.

7. The single transistor cell of claim 1, wherein the semiconductor layer is formed of an oxide such as SnO$_2$.

8. The single transistor cell of claim 1, wherein the word line is formed of a material having a high work function.

9. The single transistor cell of claim 8, wherein the word line is formed of polysilicon doped with impurities or aluminum.

10. The single transistor cell of claim 1, wherein the word line is formed of polysilicon doped with impurities or aluminum.

11. The single transistor cell of claim 1, wherein the ferroelectric line has a planarized surface.

12. The single transistor cell of claim 1, further comprising:

a thin oxide layer formed of Al2O3 by a method such as atomic layer deposition (ALD) between the semiconductor layer and word line.

13. A single transistor cell comprising:

an island type semiconductor layer as an active region formed on a ferroelectric layer;

a word line crossing the semiconductor layer;

a source formed on the semiconductor layer on a first side of of the word line, and a drain formed on the semiconductor layer on a second side of the word line;

a plate line formed below the ferroelectric layer to face the word line, crossing the word line;

a drive line connected to the source; and a bit line connected to the drain.

14. The single transistor cell of claim 13, wherein the drive line crosses the bit line.

* * * * *